United States Patent
Choi et al.

(10) Patent No.: US 8,803,334 B2
(45) Date of Patent: Aug. 12, 2014

(54) SEMICONDUCTOR PACKAGE INCLUDING A SEMICONDUCTOR CHIP WITH A THROUGH SILICON VIA

(71) Applicants: Yun-seok Choi, Hwaseong-si (KR); Tae-je Cho, Hwaseong-si (KR)

(72) Inventors: Yun-seok Choi, Hwaseong-si (KR); Tae-je Cho, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 13/672,898

(22) Filed: Nov. 9, 2012

(65) Prior Publication Data

US 2013/0175706 A1 Jul. 11, 2013

(30) Foreign Application Priority Data

Jan. 11, 2012 (KR) ........................ 10-2012-0003454

(51) Int. Cl.

| | | |
|---|---|---|
| *H01L 25/07* | (2006.01) | |
| *H01L 25/00* | (2006.01) | |
| *H01L 23/00* | (2006.01) | |
| *H01L 25/03* | (2006.01) | |
| *H01L 25/065* | (2006.01) | |
| *H01L 23/48* | (2006.01) | |
| *H01L 25/18* | (2006.01) | |
| *H01L 23/31* | (2006.01) | |

(52) U.S. Cl.
CPC ..... *H01L 25/074* (2013.01); *H01L 2224/45139* (2013.01); *H01L 2225/06568* (2013.01); *H01L 2224/48091* (2013.01); *H01L 2224/16145* (2013.01); *H01L 2225/0651* (2013.01); *H01L 25/50* (2013.01); *H01L 2224/73204* (2013.01); *H01L 2224/06181* (2013.01); *H01L 24/24* (2013.01); *H01L 2924/10253* (2013.01); *H01L 2225/06517* (2013.01); *H01L 2224/73253* (2013.01); *H01L 23/481* (2013.01); *H01L 25/03* (2013.01); *H01L 2224/97* (2013.01); *H01L 25/18* (2013.01); *H01L 24/94* (2013.01); *H01L 2224/73267* (2013.01); *H01L 25/0657* (2013.01); *H01L 2224/92247* (2013.01); *H01L 2224/32145* (2013.01); *H01L 2224/48227* (2013.01); *H01L 2224/16225* (2013.01); *H01L 2224/0557* (2013.01); *H01L 23/3128* (2013.01); *H01L 2224/94* (2013.01); *H01L 2224/14181* (2013.01); *H01L 24/97* (2013.01); *H01L 2225/06541* (2013.01); *H01L 2924/15311* (2013.01); *H01L 2224/24225* (2013.01); *H01L 2224/73265* (2013.01); *H01L 2224/24051* (2013.01)

USPC ............ 257/777; 257/E23.069; 257/E23.068; 257/E23.011; 257/E25.018; 257/778; 257/737; 257/738; 257/774; 257/686; 257/723; 257/728

(58) Field of Classification Search
USPC .......... 257/777, 778, 737, 738, 774, E23.069, 257/E23.068, E23.011, E25.018, 686, 685, 257/723, 728, 773

See application file for complete search history.

(56) References Cited

U.S. PATENT DOCUMENTS

| | | | |
|---|---|---|---|
| 7,871,925 B2 | 1/2011 | Kim et al. | |
| 7,883,938 B2 | 2/2011 | Kolan et al. | |
| 7,948,095 B2 | 5/2011 | Ng et al. | |
| 8,436,455 B2 * | 5/2013 | Eun | 257/686 |
| 8,445,996 B2 * | 5/2013 | Kim et al. | 257/659 |
| 2009/0004777 A1 | 1/2009 | Kolan et al. | |
| 2009/0181494 A1 | 7/2009 | Kim et al. | |
| 2009/0200662 A1 | 8/2009 | Ng et al. | |
| 2010/0193229 A1 * | 8/2010 | Zhang | 174/260 |
| 2010/0261311 A1 | 10/2010 | Tsuji | |
| 2010/0314730 A1 | 12/2010 | Labeeb | |
| 2011/0057310 A1 * | 3/2011 | Kang | 257/737 |
| 2011/0193086 A1 * | 8/2011 | Lee et al. | 257/48 |
| 2011/0309475 A1 * | 12/2011 | Lee | 257/532 |
| 2012/0038045 A1 * | 2/2012 | Lee | 257/738 |
| 2012/0086123 A1 * | 4/2012 | Park et al. | 257/738 |
| 2012/0126431 A1 * | 5/2012 | Kim et al. | 257/777 |
| 2012/0171814 A1 * | 7/2012 | Choi et al. | 438/107 |

| | | | | |
|---|---|---|---|---|
| 2012/0175702 | A1* | 7/2012 | Shibib et al. | 257/334 |
| 2012/0280405 | A1* | 11/2012 | Hwang et al. | 257/777 |
| 2012/0292746 | A1* | 11/2012 | Lee et al. | 257/621 |
| 2013/0000978 | A1* | 1/2013 | Choi et al. | 174/94 R |
| 2013/0001797 | A1* | 1/2013 | Choi et al. | 257/774 |
| 2013/0021760 | A1* | 1/2013 | Kim et al. | 361/729 |
| 2013/0032947 | A1* | 2/2013 | Park et al. | 257/774 |
| 2013/0043584 | A1* | 2/2013 | Kwon et al. | 257/737 |
| 2013/0049221 | A1* | 2/2013 | Han et al. | 257/774 |
| 2013/0052760 | A1* | 2/2013 | Cho et al. | 438/15 |
| 2013/0161800 | A1* | 6/2013 | Byun et al. | 257/667 |
| 2013/0175702 | A1* | 7/2013 | Choi et al. | 257/774 |

FOREIGN PATENT DOCUMENTS

| | | |
|---|---|---|
| JP | 2010-251547 | 4/2010 |
| KR | 10-0549311 | 2/2002 |
| KR | 10-2011-0048733 | 12/2011 |

* cited by examiner

*Primary Examiner* — Alexander Oscar Williams (74) *Attorney, Agent, or Firm* — Stanzione & Kim, LLP (57) ABSTRACT

A semiconductor package including a substrate, a chip stack portion disposed on the substrate and including a plurality of first semiconductor chips, at least one second semiconductor chip disposed on the chip stack portion, and a signal transmitting medium to electrically connect the at least one second semiconductor chip and the substrate to each other, such that the chip stack portion is a parallelepiped structure including a first chip that is a semiconductor chip of the plurality of first semiconductor chips and includes a through silicon via (TSV), a second chip that is another semiconductor chip of the plurality of first semiconductor chips and electrically connected to the first chip through the TSV, and an internal sealing member to fill a space between the first chip and the second chip.

20 Claims, 10 Drawing Sheets

SEMICONDUCTOR PACKAGE INCLUDING A SEMICONDUCTOR CHIP WITH A THROUGH SILICON VIA

CROSS-REFERENCE TO RELATED APPLICATIONS

This application claims priority under 35 U.S.C.§119 from Korean Patent Application No. 10-2012-0003454, filed on Jan. 11, 2012, in the Korean Intellectual Property Office, the disclosure of which is incorporated herein in its entirety by reference.

BACKGROUND

1. Field

The present general inventive concept relates to a semiconductor package, and more particularly, to a semiconductor package including a semiconductor chip including a through silicon via (TSV).

2. Description of the Related Art

In general, a packaging process is performed on semiconductor chips formed by performing a variety of semiconductor processes on a wafer to completely form a semiconductor package. Recent technological advancements have resulted in development of small-sized and lightweight electronic products, thereby allowing semiconductor devices and semiconductor packages to have small sizes and light weight. In addition to forming an efficiently integrated semiconductor package, good design reliability and fast processability of the semiconductor package are desirable.

SUMMARY

The present general inventive concept provides a semiconductor package with high speed and high density.

Additional features and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a semiconductor package including a substrate, a chip stack portion disposed on the substrate and including a plurality of first semiconductor chips, at least one second semiconductor chip disposed on the chip stack portion, and a signal transmitting medium to electrically connect the at least one second semiconductor chip and the substrate to each other, wherein the chip stack portion is a parallelepiped structure comprising a first chip that is a semiconductor chip of the plurality of first semiconductor chips and includes a through silicon via (TSV), a second chip that is another semiconductor chip of the plurality of first semiconductor chips and electrically connected to the first chip through the TSV, and an internal sealing member filling a space between the first chip and the second chip.

The chip stack portion may be installed in the substrate to have a flip-chip type.

The signal transmitting medium may be disposed on at least one lateral surface of the chip stack portion and extends from an upper surface of the at least one second semiconductor chip so as to connect the at least one second chip and the substrate directly to each other.

An area of the at least one second semiconductor chip may be smaller than an area of an upper area of the chip stack portion.

An area of an upper surface of the chip stack portion may be determined according to a greater area from among an area of the first chip and an area of the second chip.

The internal sealing member may extend along a lateral surface of a smaller chip from among the first chip and the second chip such that the chip stack portion has a rectangular parallelepiped shape.

The first semiconductor chip disposed at the uppermost portion of the chip stack portion may be smaller than the at least one second semiconductor chip.

The internal sealing member may include an underfill portion filling a space between the plurality of first semiconductor chips, and a cover portion disposed outside the underfill portion, and is formed so as not to cover an upper surface of the first semiconductor chip disposed at the uppermost portion of the chip stack portion.

The semiconductor package may include a plurality of second semiconductor chips, and the second chip disposed at an upper portion may be smaller than the second semiconductor chip disposed at a lower portion.

The semiconductor package may further include a first sealing member to cover a lower surface and a lateral surfaces of the chip stack portion, and a second sealing member disposed outside the first sealing member and surrounding the chip stack portion and the at least one second semiconductor chip.

The signal transmitting medium may be a conductive connection portion that is connected to the at least one second semiconductor chip on an upper surface of the at least one second semiconductor chip and extends to the substrate along a lateral surface of the at least one second semiconductor chip and an upper surface of the first sealing member.

The signal transmitting medium may be a wire.

The first chip may include a logic semiconductor chip, and the second chip may include a memory semiconductor chip.

The at least one first semiconductor chip including a TSV may be disposed between the first chip and the second chip.

The foregoing and/or other aspects and utilities of the present general inventive concept may also be achieved by providing a semiconductor package including a substrate, a chip stack portion disposed on the substrate and including a semiconductor chip in which a through silicon via (TSV) is formed, and a second semiconductor chip disposed on the chip stack portion, wherein the chip stack portion is installed in the substrate to have a flip-chip type, and wherein the second semiconductor chip is electrically connected to the substrate without passing through the chip stack portion.

The foregoing and/or other aspects and utilities of the present general inventive concept may also be achieved by providing a semiconductor package, including a chip-stack portion including a plurality of chips disposed on a substrate and electrically connected to the substrate by through silicon vias (TSVs), at least one non-chip-stack portion semiconductor chip disposed above the chip-stack portion and electrically connected to the substrate by a respective signal transmitting medium, and an internal sealing member to fill a space between the plurality of chips within the chip-stack portion.

Each of the signal transmitting mediums may extend from the respective chip to the substrate outside of the internal sealing member.

The chip-stack portion may be larger than the at least one non-chip-stack portion semiconductor chip.

The TSVs may be formed integrally within at least one of the plurality of chips within the chip-stack portion.

The semiconductor package may further include a plurality of bumps to correspond to at least some of the TSVs to electrically connect at least one of the plurality of chips within the chip-stack portion to the substrate.

The internal sealing member may be further disposed at side portions of at least one of the plurality of chips within the chip-stack portion.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. Expressions such as "at least one of," when preceding a list of elements, modify the entire list of elements and do not modify the individual elements of the list.

The terms "first," "second," and the like, and "primary," "secondary," and the like, as used herein do not denote any order, quantity, or importance, but rather are used to distinguish one element, region, component, layer, or section from another.

In drawings, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the drawings, like reference numerals denote like elements. Further, various elements and regions are schematically illustrated, and thus are not limited by relative sizes or intervals illustrated.

Figure 1:
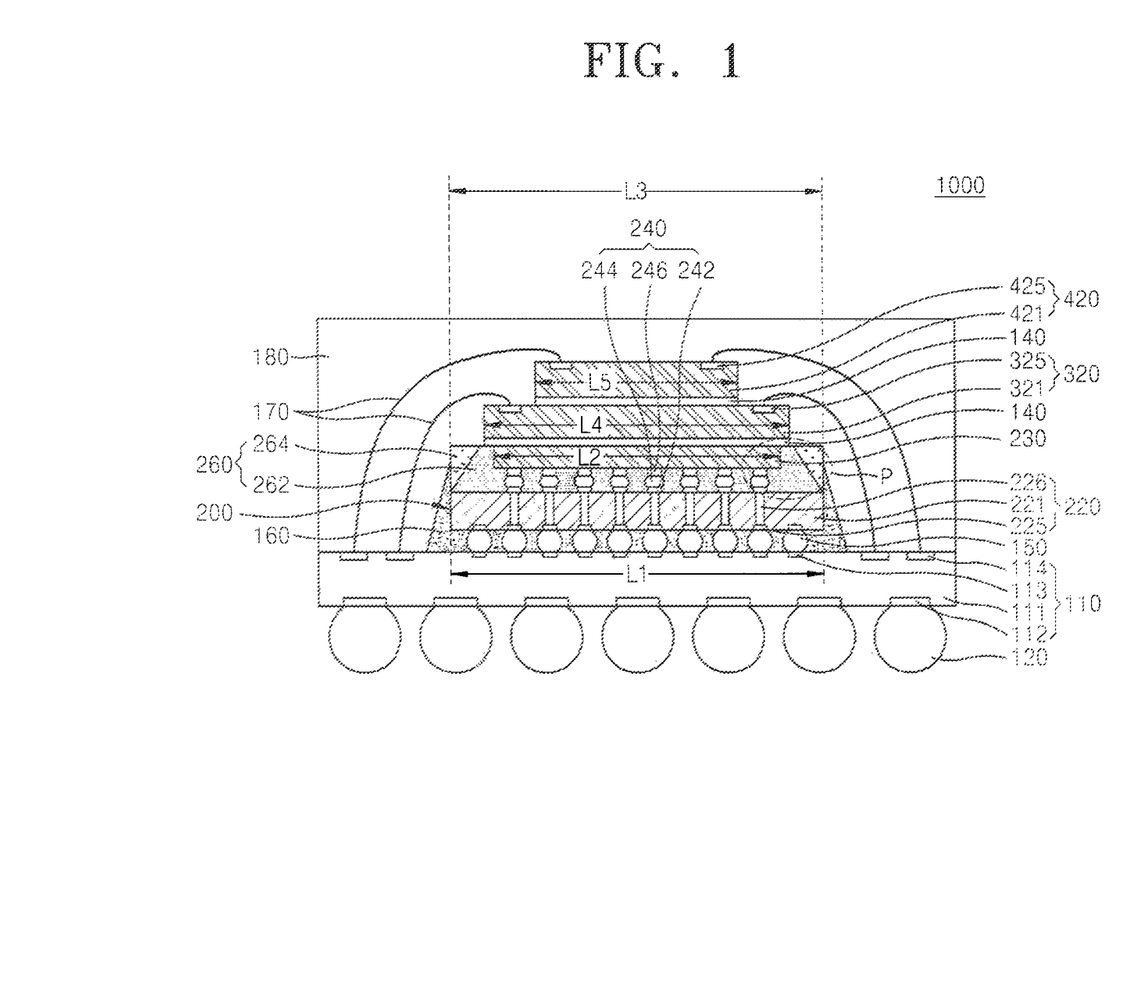
FIG. 1 is a cross-sectional view of a semiconductor package according to an exemplary embodiment of the present general inventive concept.

FIG. 1 is a cross-sectional view of a semiconductor package 1000 according to an exemplary embodiment of the present general inventive concept.

Referring to FIG. 1, the semiconductor package 1000 includes a substrate 110, a chip stack portion 200, a second semiconductor chip 320, and a third semiconductor chip 420. The semiconductor package 1000 includes solder balls 120, a first sealing member 160, and a second sealing member 180.

The substrate 110 supports the chip stack portion 200 and includes a body portion 111, lower pads 112 formed on a lower surface of the body portion 111, intermediate pads 113 formed on an upper surface of the body portion 111, and upper pads 114 also formed on the upper surface of the body portion 111. The substrate 110 may include, for example, silicon, glass, ceramic, or plastic, but is not limited thereto. The substrate 110 may be formed based on an active wafer or an interposer substrate. In this case, the active wafer refers to a wafer on which a semiconductor chip is to be formed, such as a silicon wafer. In addition, the substrate 110 may include a single layer or a multi-layered structure including wiring patterns formed therein.

The chip stack portion 200 may include a first chip 220, a second chip 230, connection members 240, and an internal sealing member 260.

The first chip 220 includes a body portion 221, chip pads 225 formed in the first chip 220, and through silicon vias (TSVs) 226 formed in the first chip 220. The chip pads 225 may be formed of a conductive material on a lower surface of the body portion 221 and may be electrically connected to the TSVs 226 via a passivation layer (not illustrated). In addition, the chip pads 225 may be connected to the TSVs 226 through a wiring layer (not illustrated) formed in the body portion 221 rather than being connected directly to the TSVs 226. The numbers and shapes of the chip pads 225 and the TSVs 226 are not limited to the arrangement as illustrated in FIG. 1, and may include other variants and configurations.

The TSVs 226 may include at least one metal. For example, the TSVs 226 may include a barrier metal layer (not illustrated) and a wiring metal layer (not illustrated). The barrier metal layer may include at least one of titanium (Ti), tantalum (Ta), titanium nitride (TiN), and tantalum nitride (TaN), but is not limited thereto. The wiring metal layer may include, for example, at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (VV), zinc (Zn), and zirconium (Zr), but is not limited thereto.

The second chip 230 may be electrically connected to the first chip 220 through the connection members 240. The connection members 240 may each include pad portions 242, a coupling portion 244, and a pillar portion 246. The connection members 240 may include a conductive material, for example, at least one of copper (Cu), aluminum (Al), silver (Ag), tin (Sn), gold (Au), and solder, but is not limited thereto.

An active layer may be formed on a lower surface of each of the first chip 220 and the second chip 230. Thus, the chip stack portion 200 may be installed in the substrate 110 to have a flip-chip type. More specifically, the flip-chip type is also known as controlled collapse chip connection (a.k.a., C4), and is a method to interconnect semiconductor devices, such as IC chips and microelectromechanical systems (MEMS), to external circuitry with solder bumps that have been deposited onto chip pads, for example. The first chip 220 and the second chip 230 may be of a same type or of different types. The chip stack portion 200 may further include a semiconductor chip in addition to the first chip 220 and the second chip 230.

For example, the first chip 220 may be a logic semiconductor chip and the second chip 230 may be a memory semiconductor chip. The logic semiconductor chip may be a microprocessor, for example, a central processing unit (CPU), a controller, or an application specific integrated circuit (ASIC), but is not limited thereto. The memory semiconductor chip may be a volatile memory such as a dynamic random access memory (DRAM) or a static random access memory (SRAM) or a non-volatile memory such as a flash memory, but is not limited thereto.

The internal sealing member 260 may include an underfill portion 262 to fill a space between the first chip 220 and the second chip 230, and a cover portion 264 disposed outside the underfill portion 262. The internal sealing member 260 may be formed so as not to cover an upper surface of the second chip 230. In addition, the internal sealing member 260 may extend past lateral surfaces of the second chip 230 having a smaller size from among the first chip 220 and the second chip 230. When a length of a sectional view of the first chip 220, which is measured in a first direction, is a first length L1, and a length of a sectional view of the second chip 230, which is measured in the first direction similar to the first chip 220, is a second length L2, a third length L3 that is a length of a sectional view of an upper portion of the chip stack portion 200 may be determined according to the first length L1. Thus, the third length L3 may be the same or similar as the first length L1. A relationship between these sectional views may be applied to other sectional views that are not illustrated. Thus, an area of the upper surface of the chip stack portion 200 may be determined according to a size of the first chip 220 and may be the same or similar to an area of the first chip 220. As used herein, the term 'area' refers to an area on a plane, unless the context clearly indicates otherwise.

The internal sealing member 260 may be formed of an underfill resin such as an epoxy resin and may include a silica filler, or flux, but is not limited thereto. The underfill portion 262 and the cover portion 264 may include different materials. With regard to an arrangement of the underfill portion 262 and the cover portion 264 of the internal sealing member 260, an area P, as illustrated in FIG. 1, will be described in detail with reference to FIGS. 3A through 3C.

According to FIG. 1, the chip stack portion 200 may have a hexahedron shape due to the internal sealing member 260. During a manufacture of the semiconductor package 1000, the chip stack portion 200 may be handled as a single structure or device. This will be described in detail with reference to FIGS. 2A through 2F.

Bumps 150 may be disposed on a lower surface of the chip stack portion 200 to correspond to the intermediate pads 113, and may electrically connect the chip stack portion 200 and the substrate 110 to each other. The bumps 150 may include at least one of gold (Au), silver (Ag), platinum (Pt), aluminum (Al), copper (Cu), solder, but are not limited thereto. The bumps 150 may be formed by using a sputtering process, a plating process such as pulse plating or direct current (DC) plating, a soldering process, or a bonding process. However, the bumps 150 are not limited to the above-described materials or processes, and various types of signal transmitting media such as wires or solder balls may be used as the bumps 150.

The second semiconductor chip 320 and the third semiconductor chip 420 may be sequentially stacked on the upper surface of the chip stack portion 200. The second semiconductor chip 320 and the third semiconductor chip 420 may include body portions 321 and 421, respectively. The second semiconductor chip 320 may be installed on the chip stack portion 200 by an adhesive layer 140 and the third semiconductor chip 420 may also be installed on the second semiconductor chip 320 by the adhesive layer 140. The second semiconductor chip 320 and the third semiconductor chip 420 may each be, for example, a memory semiconductor chip, but are not limited thereto. The second semiconductor chip 320 and the third semiconductor chip 420 may include chip pads 325 and 425, respectively. The chip pads 325 and 425 may be electrically connected to the upper pads 114 of the substrate 110 by wires 170.

A length of a sectional view of the second semiconductor chip 320 is a fourth length L4 and a length of a sectional view of the third semiconductor chip 420 is a fifth length L5 that is smaller than the fourth length L4. In addition, the fourth length L4 may be greater than the second length L2 that is the length of the sectional view of the second chip 230, and may be smaller than the third length L3 that is the length of the sectional view of upper surface of the chip stack portion 200. A relationship between these sectional views may be applied to other sectional views that are not illustrated.

Thus, even when the second semiconductor chip 320 having a greater area than the second chip 230 is stacked on the second chip 230, since the upper surface of the chip stack portion 200 has a greater upper surface than the second semiconductor chip 320, the second semiconductor chip 320 may be stably disposed on the chip stack portion 200. In addition, since the third semiconductor chip 420 has a smaller area than the second semiconductor chip 320, the upper surface of the second semiconductor chip 320 may be partially exposed and the second semiconductor chip 320 may be electrically connected to the substrate 110 through the wires 170 by the chip pads 325 disposed on the exposed upper surface of the second semiconductor chip 320.

The wires 170 are types of signal transmitting media to electrically connect the chip pads 325 and 425 and the upper pads 114 to each other. The wires 170 may connect the substrate 110 directly to each of the second semiconductor chip 320 and the third semiconductor chip 420. The wires 170 may extend from the chip pads 325 and 425 and may be connected to the upper pads 114 past the lateral surfaces of the chip stack portion 200. The wires 170 may be wires for semiconductor bonding, may include at least one of Au, Ag, Pt, Al, Cu, Pd, Ni, Co, Cr, and Ti, but are not limited thereto, and may be formed by a wire bonding device.

The first sealing member 160 may partially cover the bumps 150, a lower surface of the chip stack portion 200, and a lateral surface of the chip stack portion 200. The first sealing member 160 may be formed of, for example, a silicon-based material, a thermosetting material, a thermoplastic material, or a UV treatment material, but is not limited thereto.

The second sealing member 180 may surround and protect the chip stack portion 200, the second semiconductor chip 320, and the third semiconductor chip 420 on the substrate 110. The second sealing member 180 may be formed of, for example, a silicon-based material, a thermosetting material, a thermoplastic material, or a UV treatment material, but is not limited thereto. In addition, the second sealing member 180 may be formed of a polymer such as a resin, for example, an epoxy molding compound (EMC), but is not limited thereto. According to another embodiment of the present general inventive concept, the first sealing member 160 and the second sealing member 180 may be formed to be integrated with each other rather than being separately formed from each other.

The solder balls 120 may be formed on the lower surface of the substrate 110. The semiconductor package 1000 may be electrically connected to an external device, for example, a system board or a main board via the solder balls 120. The solder balls 120 may include at least one of tin (Sn), silver (Ag), copper (Cu), and aluminum (Al) in addition to solder, but are not limited thereto. In addition, the shape of the solder balls 120 is not limited to a ball shape illustrated in FIG. 1. For example, the shape of the solder balls 120 may be changed in various ways, for example, a cylindrical shape, a polyprism shape, or a polyhedron shape, but is not limited thereto.

According to FIG. 1, the semiconductor package 1000 may include a plurality of semiconductor chips such as the first chip 220, the second chip 230, the second semiconductor chip 320, and the third semiconductor chip 420. The plurality of semiconductor chips may perform a plurality of functions. The semiconductor package 1000 may include the chip stack portion 200 in which portions of the semiconductor package 1000 are connected by the TSVs 226 to embody a system in package (SIP) with high speed and high density. In addition, the semiconductor package 1000 includes the chip stack portion 200 having a parallelepiped shape, thereby loosening restrictions on the shape of semiconductor chips stacked on the chip stack portion 200.

FIGS. 2A through 2F are cross-sectional views to explain a method of manufacturing a semiconductor package 1000, according to an exemplary embodiment of the present general inventive concept.

Figure 2A:
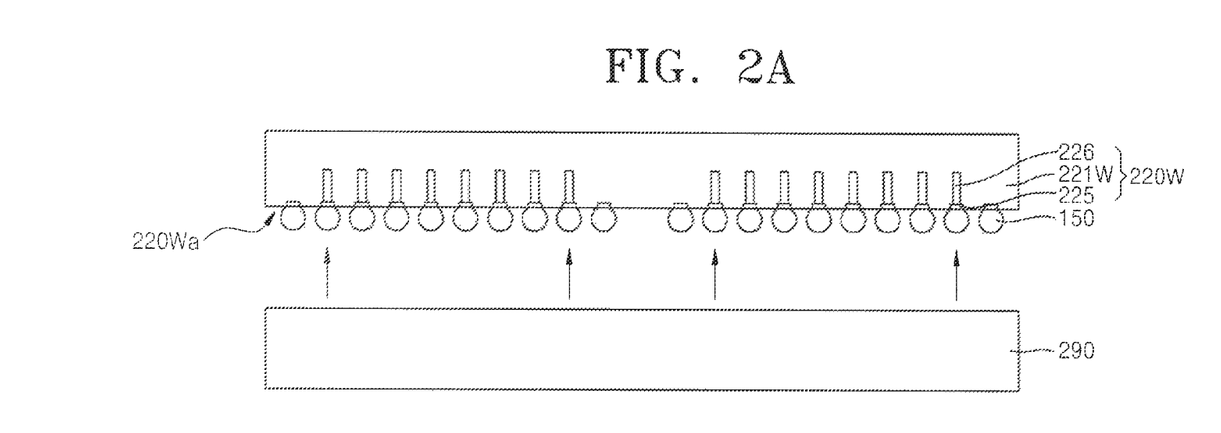
FIGS. 2A through 2F are cross-sectional views to explain a method of manufacturing a semiconductor package, according to an exemplary embodiment of the present general inventive concept.

Referring to FIGS. 1 and 2A, the chip stack portion 200 is prepared. A base wafer 220W in which a plurality of through silicon vias (TSVs) 226 are formed is prepared. The base wafer 220W includes a body portion 221W and the chip pads 225. Through subsequent processes, the first chip 220 of FIG. 1 is formed. The bumps 150 are arranged to correspond to the chip pads 225 on a first surface 220Wa of the base wafer 220W. In this case, the bumps 150 are formed through a subsequent process. The chip pads 225 and the bumps 150 may be respectively connected via the TSVs 226. Some of the chip pads 225 and some of the bumps 150 may not be connected to the TSVs 226 and in this case, may be connected to a wiring layer (not illustrated) in the base wafer 220W.

Figure 2B:
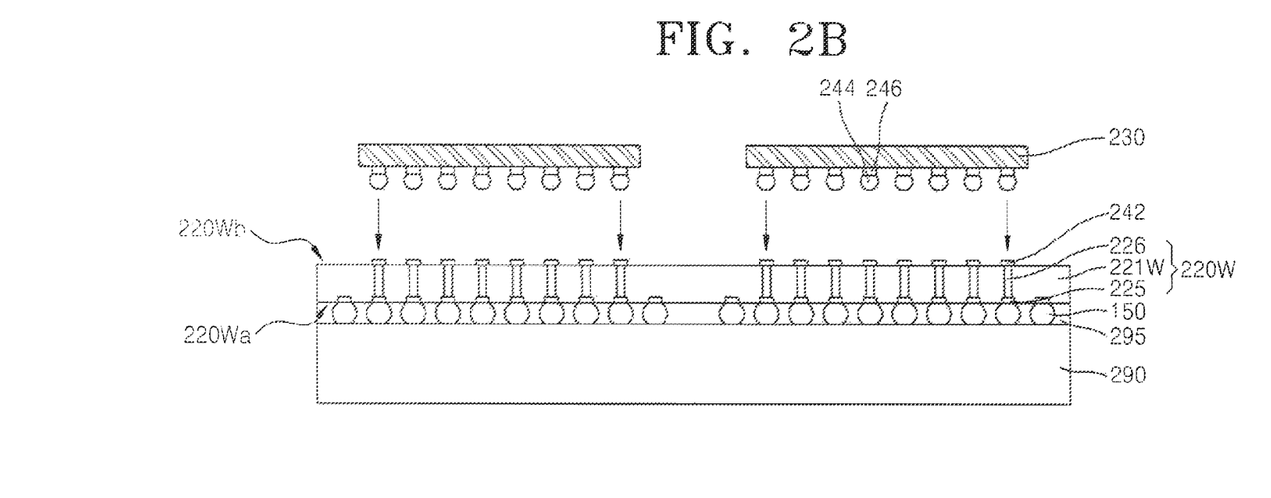

Referring to FIG. 2B, in the base wafer 220W, the first surface 220Wa through which the TSVs 226 are exposed may be adhered to a carrier substrate 290 by using an adhesive layer 295. The adhesive layer 295 may be formed of a predetermined material such that the carrier substrate 290 may be detached from the adhesive layer 295 in a subsequent process, such as a film type material or a liquid type material.

The carrier substrate 290 is used to thin the base wafer 220W in a subsequent process. When the thinning is completed, since the base wafer 220W may have a thickness of several tens of μm, a support portion such as a wafer supporting system (WSS) is required in order to use the base wafer 220W having a small thickness. The carrier substrate 290 may include silicon, germanium, silicon-germanium, gallium-arsenic (GaAs), glass, plastic, or ceramic, but is not limited thereto.

Referring to FIG. 2B, the base wafer 220W may be thinned such that the TSVs 226 may be exposed over a second surface 220Wb of the base wafer 220W. After the thinning is performed, the pads 242 may be formed on the TSVs 226 that are exposed over the second surface 220Wb.

Figure 2C:
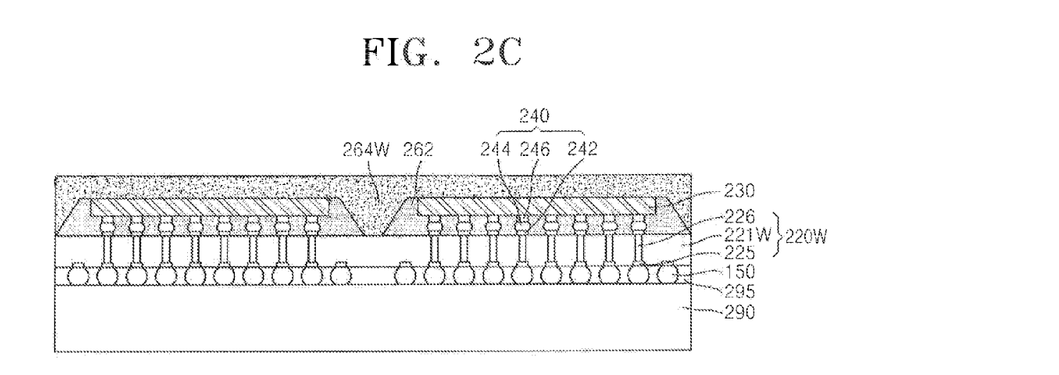

Referring to FIGS. 2B and 2C, the second chip 230, on which the pillar portion 246 and the coupling portion 244 are disposed, may be connected to the base wafer 220W. The base wafer 220W and the second chip 230 may be connected to each other by physically connecting the pads 242 and the coupling portion 244 to portions thereof that respectively correspond to each other.

Referring to FIG. 2C, the underfill portion 262 is formed on the base wafer 220W to which second chips 230 are attached to fill a space between the connection members 240, and a space between the second chip 230 and the base wafer 220W. A height and shape of the underfill portion 262 may not be limited to those illustrated in FIG. 2C. For example, the underfill portion 262 may be formed at a lower layer level than upper surfaces of the second chips 230.

Then, a wafer cover portion 264W is formed on the underfill portion 262 and the second chip 230. The wafer cover portion 264W may be formed of an underfil resin, for example, an epoxy resin and may include a silica filler, or a flux filler, but is not limited thereto. The wafer cover portion 264W may include a different material from the underfill portion 262. Alternatively, the wafer cover portion 264W and the underfill portion 262 may include the same material, for example, a filler at a different ratio.

Figure 2D:
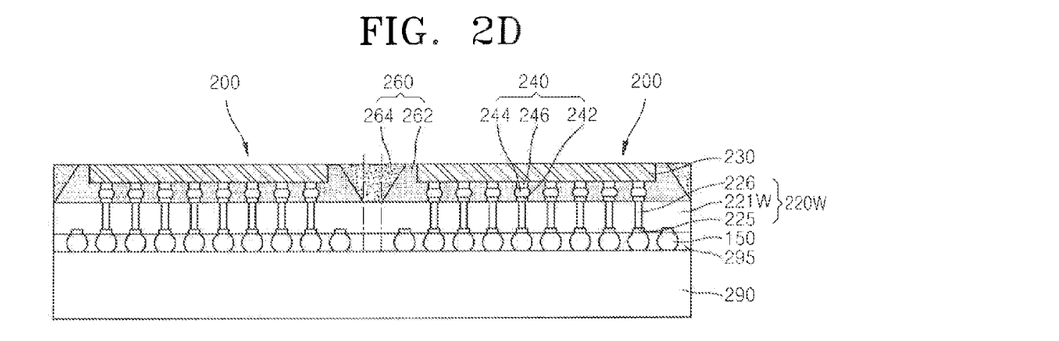

Referring to FIG. 2D, an upper surface of the second chip 230 is exposed by grinding an upper surface of the wafer cover portion 264W.

Then, a singulation process is performed along a region indicated by dotted lines to form chip stack portions 200 each including the first chip 220, the second chip 230, and the internal sealing member 260. The singulation process may be performed by blade sawing or laser sawing while the first chip 220 is adhered onto the carrier substrate 290. Then, the chip stack portions 200 may be detached from the carrier substrate 290, thereby completing the chip stack portions 200.

Alternatively, when an electrical die sorting (EDS) test is performed prior to the singulation process, the carrier substrate 290 may be first detached and a separate carrier substrate (not illustrated) may be attached to an upper surface of the second chip 230. Accordingly, the EDS test may be performed and then the singulation process may be performed on a separate carrier substrate (not illustrated).

Figure 2E:
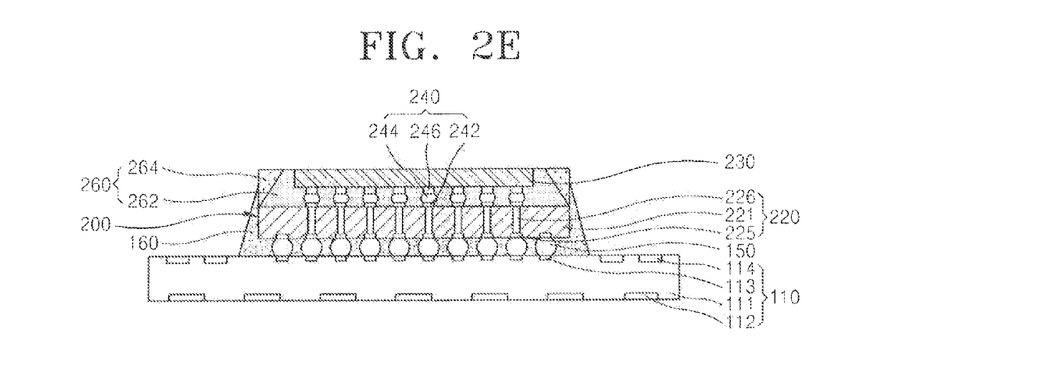

Referring to FIG. 2E, the chip stack portion 200 may be attached onto the substrate 110. The bumps 150 of the chip stack portion 200 and the intermediate pads 113 disposed at an upper portion of the body portion 111 of the substrate 110 may be adhered to each other such that the chip stack portion 200 may be installed on the substrate 110. Additionally, the upper pads 114 are also formed on the upper surface of the body portion 111.

As illustrated in FIG. 2E, the chip stack portion 200 may be installed on the substrate 110 by using a similar process and equipment where a single semiconductor chip is installed on the substrate 110. Since the chip stack portion 200 may be formed as a single device and a parallelepiped shape, it is easy to handle the chip stack portion 200 when the chip stack portion 200 may be installed on the substrate 110. Then, the first sealing member 160 may be formed to partially cover the bumps 150, a lower surface of the chip stack portion 200, and a lateral surface of the chip stack portion 200.

Figure 2F:
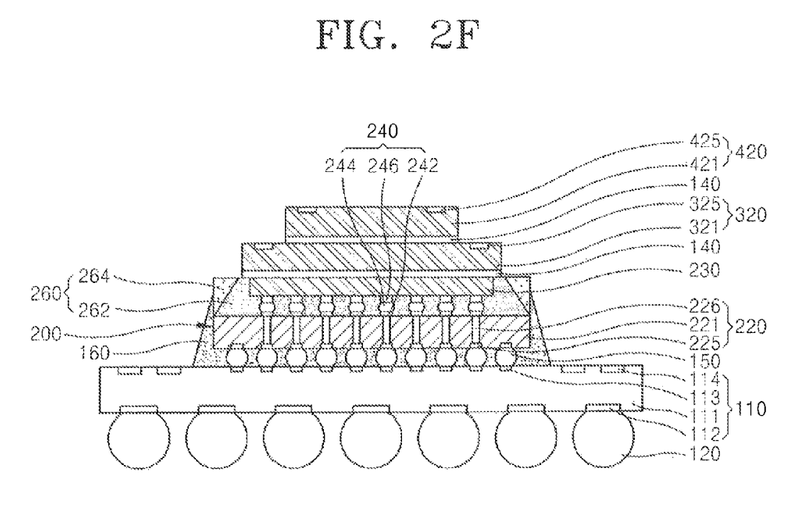

Referring to FIG. 2F, the second semiconductor chip 320 and the third semiconductor chip 420 are sequentially stacked on the chip stack portion 200. The second semiconductor chip 320 and the third semiconductor chip 420 are respectively installed on the chip stack portion 200 and the second semiconductor chip 320 by using the adhesive layer 140.

Then, the solder balls 120 may be formed on the lower surface of the substrate 110 to correspond to the lower pads 112. The solder balls 120 may be formed after the wires 170 of FIG. 1 and the second sealing member 180 of FIG. 1 are formed.

Still referring to FIGS. 1 and 2F, the wires 170 may be formed to connect the chip pads 325 and 425, which are located at upper portions of the body portions 321 and 421, respectively, and the substrate 110 to each other, and the second sealing member 180 may be formed, thereby completing the semiconductor package 1000 of FIG. 1.

Figure 3A:
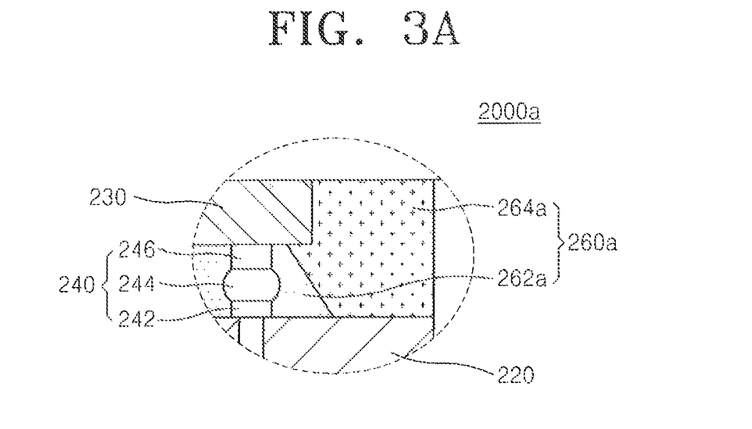
FIGS. 3A through 3C are partial cross-sectional views of semiconductor packages according to exemplary embodiments of the present general inventive concept.
Figure 3B:
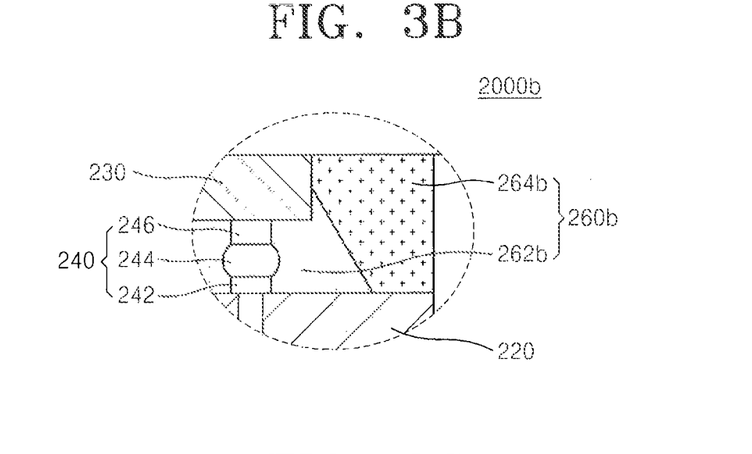
Figure 3C:
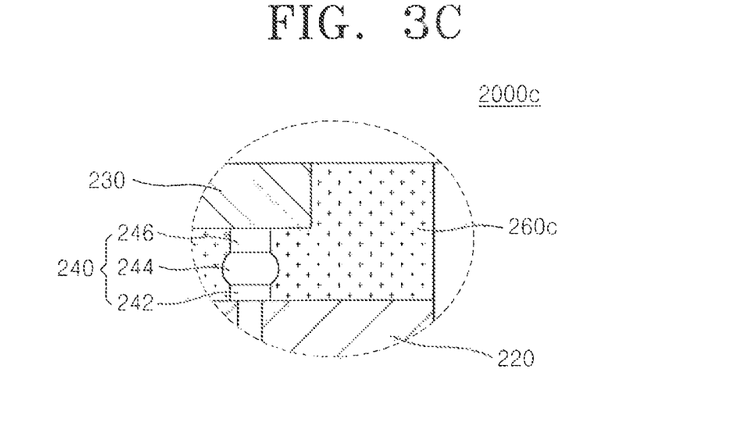

FIGS. 3A through 3C are partial cross-sectional views of semiconductor packages 2000a, 2000b, and 2000c according to exemplary embodiments of the present general inventive concept. FIGS. 3A through 3C illustrate regions corresponding to a region P, as illustrated in FIG. 1.

Referring to FIG. 3A, an internal sealing member 260a may include an underfill portion 262a to fill a space between the first chip 220 and the second chip 230, and a cover portion 264a disposed outside the underfill portion 262a. According to FIG. 3A, in the semiconductor package 2000a, the underfill portion 262a may not completely cover a lateral surface of the second chip 230, unlike in the semiconductor package 1000 of FIG. 1. As illustrated in FIG. 3A, an upper boundary between the underfill portion 262a and the cover portion 264a may be formed on a lower surface of the second chip 230.

Referring to FIG. 3B, an internal sealing member 260b may include an underfill portion 262b to fill a space between the first chip 220 and the second chip 230, and a cover portion 264b disposed outside the underfill portion 262b. According to FIG. 3B, in the semiconductor package 2000b, the underfill portion 262b may not completely cover a lateral surface of the second chip 230, unlike in the semiconductor package 1000 of FIG. 1. As illustrated in FIG. 3B, an upper boundary between the underfill portion 262b and the cover portion 264b may be formed a lateral surface of the second chip 230.

Referring to FIG. 3C, an internal sealing member 260c may be a single layer to fill a space between the first chip 220 and the second chip 230. According to FIG. 3C, the semiconductor package 2000c may be formed, for example, by unifying processes to form the underfill portion 262 and the wafer cover portion 264W, which have been described with reference FIG. 2C. For example, the underfill portion 262 of FIG. 2C is not formed but the internal sealing member 260c is formed to completely form the semiconductor package 2000c. As such, the internal sealing member 260c may be formed by using a molded underfill (MUF) process.

Figure 4:
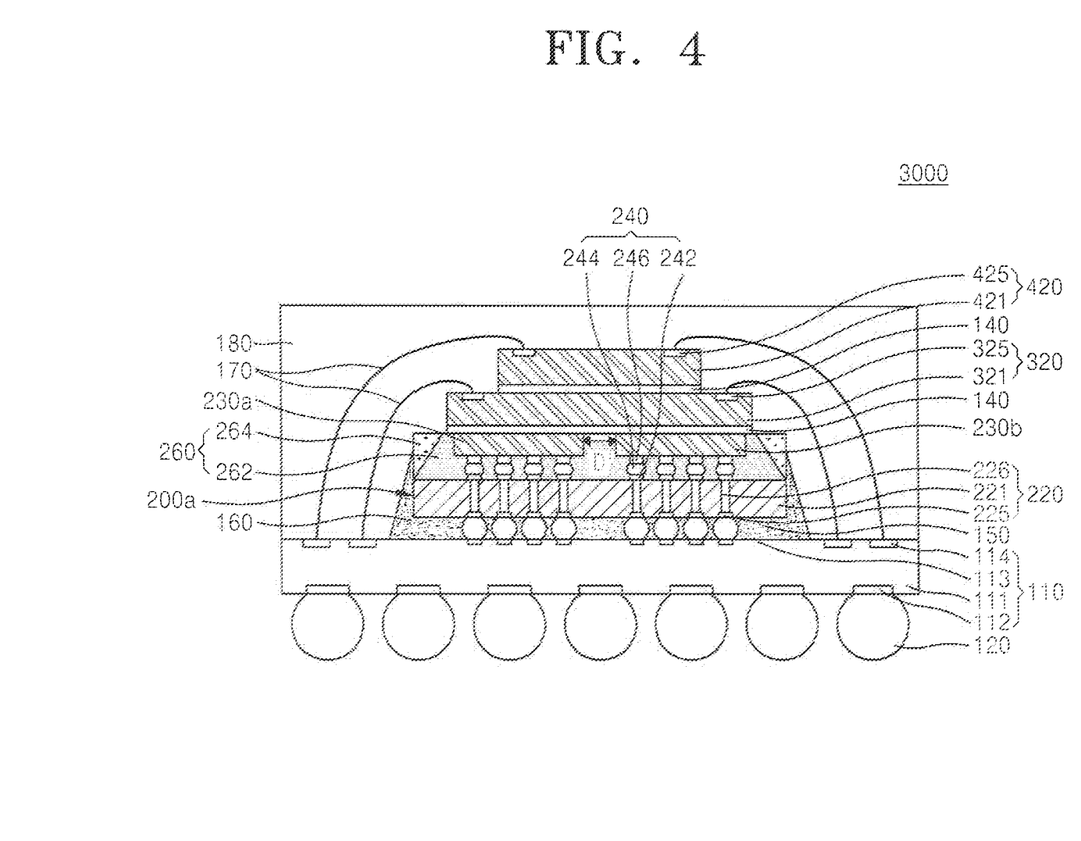
FIG. 4 is a cross-sectional view of a semiconductor package according to an exemplary embodiment of the present general inventive concept.

FIG. 4 is a cross-sectional view of a semiconductor package 3000 according to an exemplary embodiment of the present general inventive concept.

In FIGS. 1 and 4, same elements are denoted by same reference numerals and a repeated explanation thereof will not be given.

Referring to FIG. 4, the semiconductor package 3000 includes the substrate 110, a chip stack portion 200a, the second semiconductor chip 320, and the third semiconductor chip 420. The chip stack portion 200a may include the first chip 220, two second chips 230a and 230b, the connection members 240, and the internal sealing member 260.

The second chips 230a and 230b may be disposed on the first chip 220 to be spaced apart from each other by a predetermined distance D. The second chips 230a and 230b may be electrically connected to the first chip 220 by the connection members 240. The number of the second chips 230a and 230b may be changed in various ways. According to another embodiment of the present general inventive concept, a number of second chips may be three or more.

Active layers may be formed on lower surfaces of the first chip 220 and the second chips 230a and 230b, respectively. Thus, the chip stack portion 200a may be installed in the substrate 110 to have a flip-chip type. The first chip 220 and the second chips 230a and 230b may be of the same type or different types. For example, the first chip 220 may be a logic semiconductor chip and the second chips 230a and 230b may each be a memory semiconductor chip.

The internal sealing member 260 may include the underfill portion 262 to fill a space between the first chip 220 and the second chips 230a and 230b, and the cover portion 264 disposed outside the underfill portion 262. According to another embodiment of the present general inventive concept, the cover portion 264 may be partially formed in a region between the second chips 230a and 230b according to the distance D. According FIG. 4, the chip stack portion 200a may have a parallelepiped shape by the internal sealing member 260. During manufacture of the semiconductor package 3000, the chip stack portion 200a may be handled as a single unit device. In addition, when a total area of the second chips 230a and 230b is greater than an area of the first chip 220, the second semiconductor chip 320 and the third semiconductor chip 420 may be stacked on the second chips 230a and 230b without being greatly affected by shapes of the second chips 230a and 230b and the distance D.

The semiconductor package 3000 may be formed by connecting the second chips 230a and 230b and the base wafer 220W to each other, as illustrated in the process described with reference to FIG. 2B.

Figure 5:
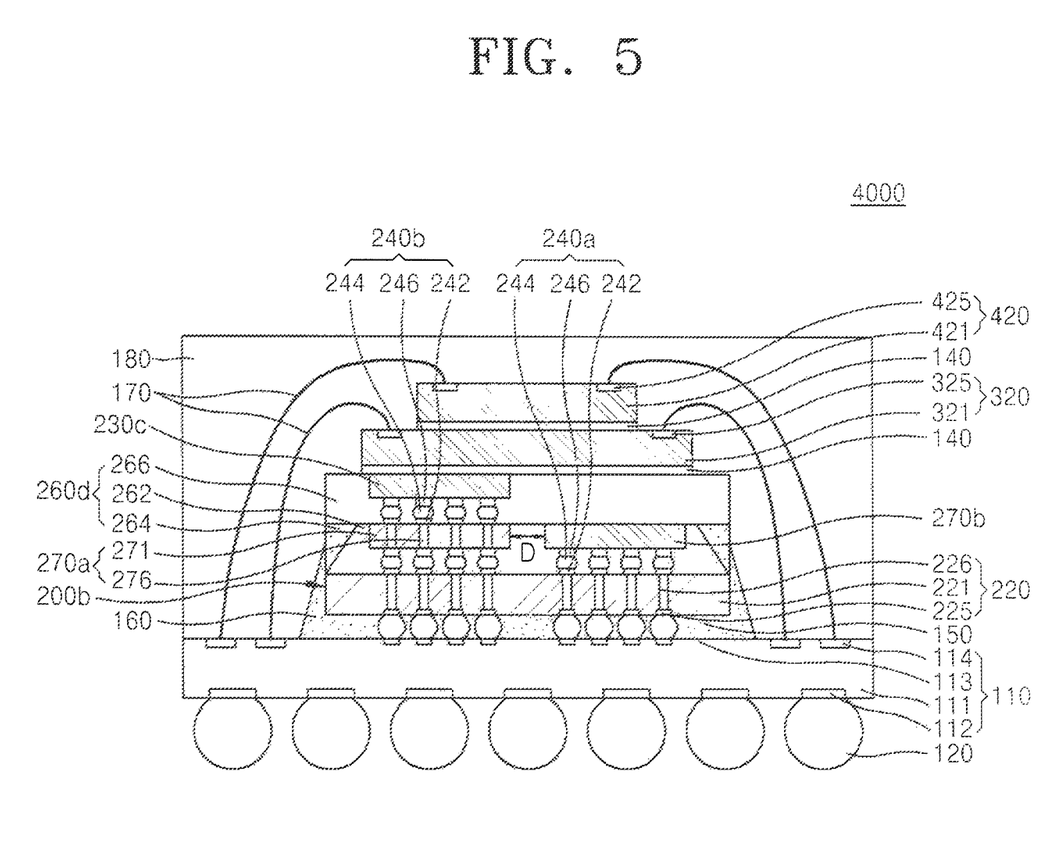
FIG. 5 is a cross-sectional view of a semiconductor package according to an exemplary embodiment of the present general inventive concept.

FIG. 5 is a cross-sectional view of a semiconductor package 4000 according to an exemplary embodiment of the present general inventive concept.

In FIGS. 1 and 5, same elements are denoted by same reference numerals and a repeated explanation thereof will not be given.

Referring to FIG. 5, the semiconductor package 4000 includes the substrate 110, a chip stack portion 200b, the second semiconductor chip 320, and the third semiconductor chip 420. The chip stack portion 200b may include the first chip 220, a second chip 230c, third chips 270a and 270b, connection members 240a and 240b, and an internal sealing member 260d.

The third chips 270a and 270b may be disposed on the first chip 220 by a predetermined distance D. The third chip 270a may include TSVs 276 and a body portion 271. The third chips 270a and 270b may be electrically connected to the first chip 220 through the connection members 240a. The connection members 240a may include the pad portion 242, the coupling portion 244, and the pillar portion 246.

The second chip 230c may be disposed on the third chip 270a. The second chip 230c may be electrically connected to the third chip 270a by the connection members 240b. According to another embodiment of the present general inventive concept, one or more semiconductor chip including a TSV may be further formed between the second chip 230c and the third chip 270a. The connection members 240b may each include the pad portion 242, the coupling portion 244, and the pillar portion 246. The connection members 240a and 240b may include a conductive material, for example, at least one of copper (Cu), aluminum (Al), silver (Ag), tin (zn), gold (Au), and solder, but are not limited thereto.

Active layers may be formed on lower surfaces of the first chip 220, the second chip 230c, and the third chips 270a and 270b, respectively. Thus, the chip stack portion 200b may be installed in the substrate 110 to have a flip-chip type. The first chip 220, the second chip 230c, and the third chips 270a and 270b may be of the same type or different types. For example, the first chip 220 may be a logic semiconductor chip and the second chip 230c and the third chips 270a and 270b may each be a memory semiconductor chip.

The internal sealing member 260d may include the underfill portion 262 to fill a space between the first chip 220 and the third chips 270a and 270b, the cover portion 264 disposed outside the underfill portion 262, and an upper cover portion 266 formed on lateral surfaces of the second chip 230c. The internal sealing member 260d may be formed of an underfill resin such as an epoxy resin and may include a silica filler, or flux, but is not limited thereto. The underfill portion 262, the cover portion 264, and the upper cover portion 266 may include different materials. Alternatively, the cover portion 264 and the upper cover portion 266 may be formed of a same material. According to the present embodiment, the chip stack portion 200b may have a parallelepiped shape by the internal sealing member 260d. During manufacture of the semiconductor package 4000, the chip stack portion 200a may be handled as a single unit device. In addition, when an area of the second chip 230c is smaller than a total area of lower chips, the second semiconductor chip 320 and the third semiconductor chip 420 may be staked on the second chip 230c regardless of a size of the second chip 230c.

The semiconductor package 4000 may be formed by further performing a process of stacking the second chip 230c after the grinding process that has been described with reference to FIG. 2D. In addition, the semiconductor package 4000 may be formed by further performing a process forming the upper cover portion 266 covering lateral and upper surfaces of the second chip 230c and a process of exposing an upper surface of the second chip 230c by using a grinding process.

Figure 6:
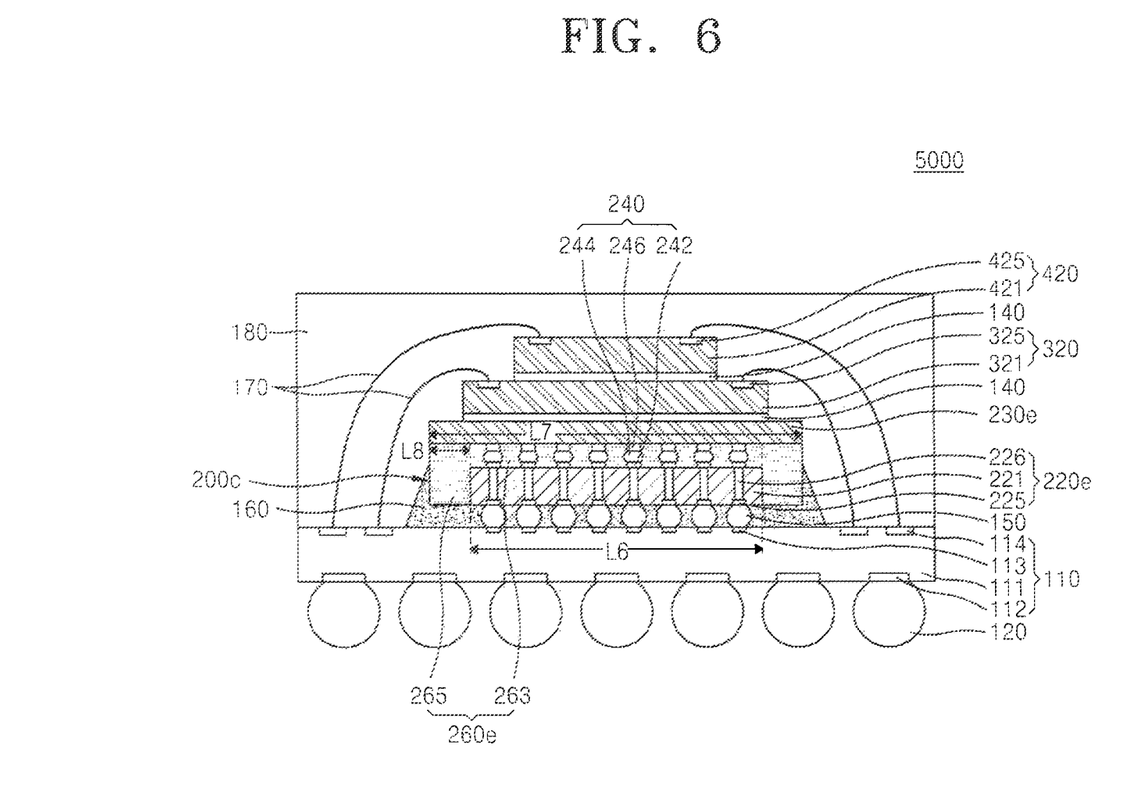
FIG. 6 is a cross-sectional view of a semiconductor package according to another exemplary embodiment of the present general inventive concept.

FIG. 6 is a cross-sectional view of a semiconductor package 5000 according to another exemplary embodiment of the present general inventive concept.

In FIGS. 1 and 6, the same elements are denoted by the same reference numerals, and a repeated explanation thereof will not be given.

Referring to FIG. 6, the semiconductor package 5000 includes the substrate 110, a chip stack portion 200c, the second semiconductor chip 320, and the third semiconductor chip 420. The chip stack portion 200c may include a first chip 220e, a second chip 230e, the connection members 240, and an internal sealing member 260e.

A sectional view of the first chip 220e may have a sixth length L6 and a sectional view of the second chip 230e may have a seventh length L7 that is greater than the sixth length L6. According to FIG. 6, with respect to the chip stack portion 200c of the semiconductor package 5000, at least one sectional view of the second chip 230e that is disposed at an upper portion may be greater than a sectional view of the first chip 220e that is disposed at a lower portion, such that the sectional views are measured in the same direction.

Active layers may be formed on lower surfaces of the first chip 220e and the second chip 230e, respectively. Thus, the chip stack portion 200c may be installed in the substrate 110 to have a flip-chip type. The first chip 220e and the second chip 230e may be of a same type or different types. For example, the first chip 220e may be a logic semiconductor chip and the second chip 230e may be a memory semiconductor chip.

The internal sealing member 260e includes a first region 263 to fill a space between the first chip 220e and the second chip 230e, and a second region 265 disposed outside the first region 263. The second region 265 refers to a region formed on a lateral surface of the first chip 220e having a smaller size from among the first chip 220e and the second chip 230e.

According to a modified embodiment of the present inventive concept, the internal sealing member 260e may include the first region 263 only. In this case, lateral surfaces of the second chip 230e may protrude from the internal sealing member 260e by an eighth length L8. Alternatively, lateral surfaces of the internal sealing member 260e may extend from lateral surfaces of the first chip 220e at a predetermined angle so as to contact the second chip 230e and lateral surfaces of the second chip 230e may protrude from the internal sealing member 260e by a smaller length than the eighth length L8.

According to the present embodiment, the semiconductor package 5000 may be formed by unifying processes for forming the underfill portion 262 and the wafer cover portion 264W, which have been described with reference to FIG. 2C. For example, the wafer cover portion 264W may not be formed but the internal sealing member 260e may be formed between the first chip 220e and the second chip 230e, thereby completing the semiconductor package 5000.

Figure 7:
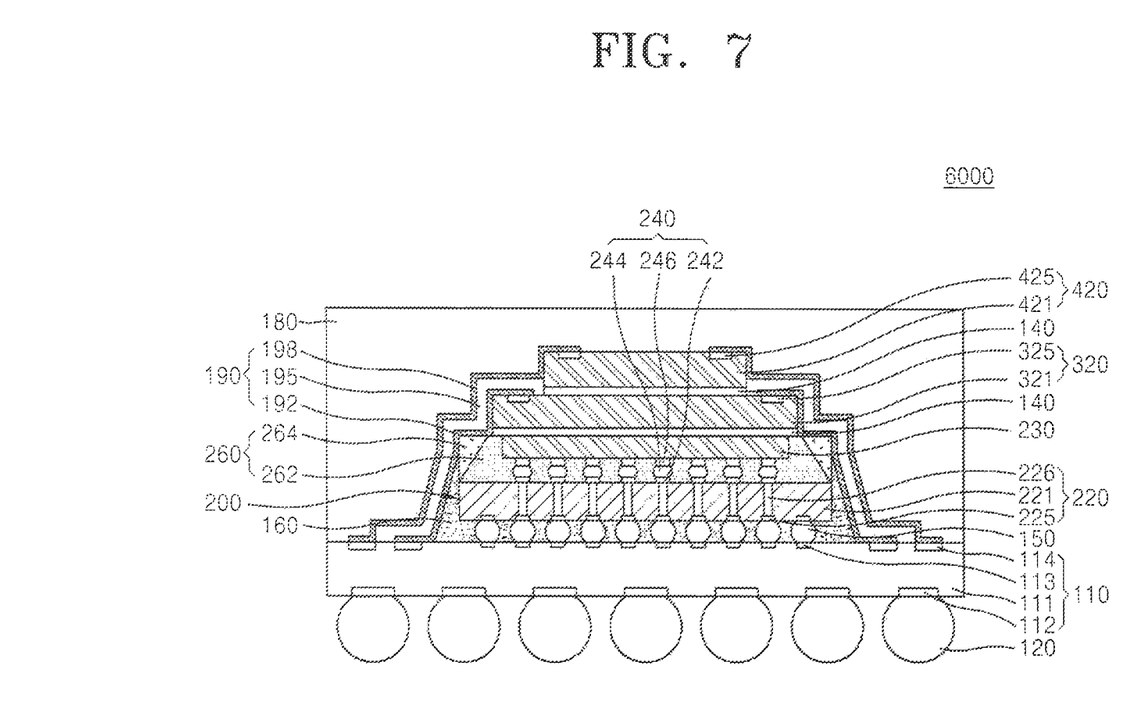
FIG. 7 is a sectional view of a cross-sectional view of a semiconductor package according to another exemplary embodiment of the present general inventive concept.

FIG. 7 is a sectional view of a cross-sectional view of a semiconductor package 6000 according to another exemplary embodiment of the present general inventive concept.

In FIGS. 1 and 7, the same elements are denoted by the same reference numerals, and a repeated explanation thereof will not be given.

Referring to FIG. 7, the semiconductor package 6000 includes the substrate 110, the chip stack portion 200, the second semiconductor chip 320, and the third semiconductor chip 420. The chip stack portion 200 may include the first chip 220, the second chip 230, the connection members 240, and the internal sealing member 260.

In the semiconductor package 6000, a conductive connection portion 190 is utilized as a signal transmitting medium instead of the wires 170 of the semiconductor package 1000 as illustrated in FIG. 1. The conductive connection portion 190 may include a first connection portion 192, a second connection portion 198, and an insulating portion 195. The conductive connection portion 190 may extend from the second semiconductor chip 320 and the third semiconductor chip 420 along lateral surfaces of the second and third semiconductor chips 320 and 420, an upper surface of the chip stack portion 200, and an upper surface of the first sealing member 160.

The first connection portion 192 and the second connection portion 198 may electrically connect the chip pads 325 and 425 of the second semiconductor chip 320 and the third semiconductor chip 420 to the upper pads 114 of the substrate 110, respectively and may be spaced apart from each other by the insulating portion 195. The first connection portion 192 and the second connection portion 198 may each include at least one of gold (Au), silver (Ag), platinum (Pt), aluminum (Al), copper (Cu), palladium (Pd), nickel (Ni), cobalt (Co), chrome (Cr), and titanium (Ti).

The semiconductor package 6000 may be formed by performing a plurality of injection processes of injecting a conductive material and an insulating material to form the conductive connection portion 190, instead of using the wires 170 as described with reference to FIGS. 1 and 2F. In addition, the conductive connection portion 190 may be applied to the embodiments illustrated in FIGS. 4 through 6.

In the semiconductor package 6000, also when the second semiconductor chip 320 and the third semiconductor chip 420, which each have a greater area than the second chip 230, are stacked on the second chip 230, the second semiconductor chip 320 and the third semiconductor chip 420 may be stably connected to the substrate 110 by the conductive connection portion 190 by forming the chip stack portion 200 having a parallelepiped shape. That is, since sizes of the chip stack portion 200, the second semiconductor chip 320, and the third semiconductor chip 420 are sequentially reduced, the conductive connection portion 190 is easily formed, thereby completing the semiconductor package 6000 having high reliability.

Figure 8:
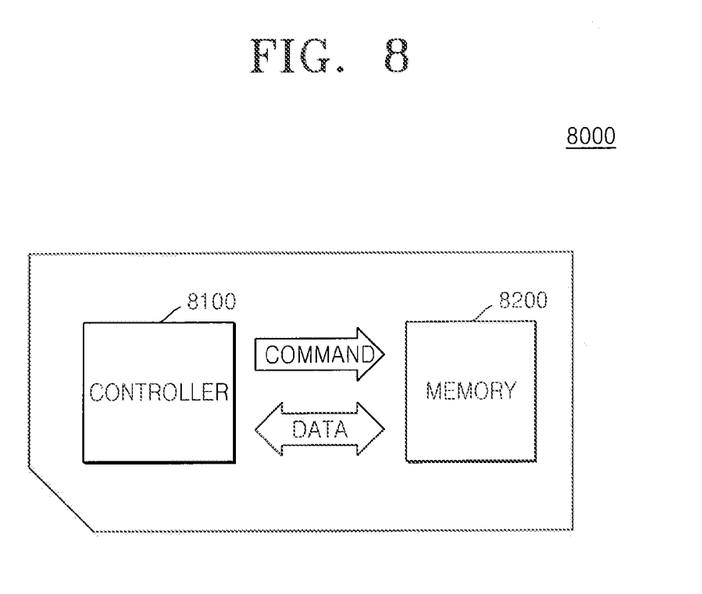
FIG. 8 is a block diagram of a memory card including a semiconductor package according to an exemplary embodiment of the present general inventive concept.

FIG. 8 is a block diagram of a memory card 8000 including a semiconductor package according to an exemplary embodiment of the present general inventive concept.

Referring to FIG. 8, a controller 8100 and a memory 8200 may be arranged within the memory card 8000 to exchange electrical signals therebetween. For example, when the controller 8100 issues a command, the memory 8200 may transmit data to the controller 8100. The controller 8100 and/or the memory 8200 may include a semiconductor package according to any one of the above-descried embodiments. The memory 8200 may include a memory array (not illustrate) or a memory array band (not illustrate).

The memory card 8000 may be used in a memory device such as various types of memory cards, for example, a memory stick card, a smart media card (SM), a secure digital (SD), a mini secure digital card (mini SD), or a multi media card (MMC), but is not limited thereto.

Figure 9:
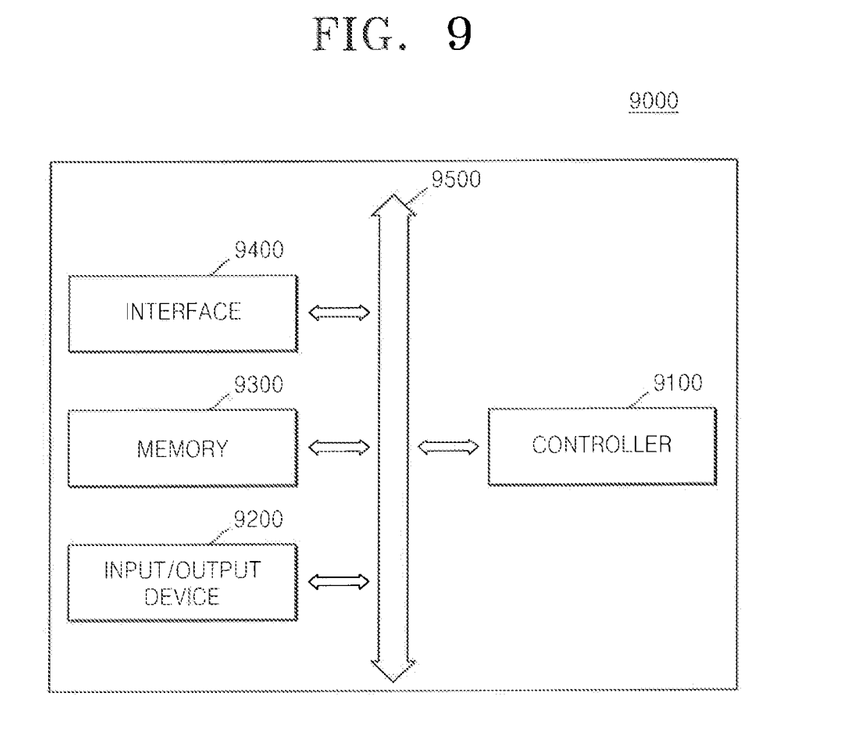
FIG. 9 is a block diagram of an electronic system including a semiconductor package according to an exemplary embodiment of the present general inventive concept.

FIG. 9 is a block diagram of an electronic system 9000 including a semiconductor package according to an embodiment of the present inventive concept.

Referring to FIG. 9, the electronic system 9000 may include a controller 9100, an input/output device 9200, a memory 9300, and an interface 9400. The electronic system 9000 may be a mobile system or a system to transmit or receive information. The mobile system may be, for example, a personal digital assistant (PDA), a portable computer, a web tablet, a wireless phone, a mobile phone, a digital music player, or a memory card, but is not limited thereto.

The controller 9100 may execute a program and may control the electronic system 9000. The controller 9100 may be, for example, a microprocessor, a digital signal processor, or a microcontroller, but is not limited thereto. In addition, the input/output device 9200 may include input and/or output data of the electronic system 9000.

In addition, the electronic system 9000 may be connected to an external device, for example, a personal computer, a handheld device, or a network by using the input/output device 9200 and may exchange data with the external device. The input/output device 9200 may be, for example, a keypad, a keyboard, or a display, but is not limited thereto. The memory 9300 may store a code and/or data to operate the controller 9100 and/or may store data processed in the controller 9100. The controller 9100 and the memory 9300 may include a semiconductor package according to any one of the above-described embodiments of the general inventive concept. The interface 9400 may be a data transmitting path between the electronic system 9000 and an external device. The controller 9100, the input/output device 9200, the memory 9300, and the interface 9400 may communicate with each other via a bus 9500.

For example, the electronic system 9000 may be used in a mobile phone, an MP3 player, a navigation device, a portable multimedia player (PMP), a solid state disk (SSD), or household appliances, but is not limited thereto.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package, comprising:
   a substrate;
   a chip stack portion having a parallelepiped structure being disposed on the substrate and comprising a plurality of first semiconductor chips, the plurality first semiconductor chips comprising:
   a first chip of the plurality of first semiconductor chips that includes a through silicon via (TSV), and
   a second chip of the plurality of first semiconductor chips and electrically connected to the first chip through the TSV;
   an internal sealing member within the chip stack portion to fill a space between the first chip and the second chip;
   at least one second semiconductor chip disposed on the chip stack portion; and
   a signal transmitting medium to electrically connect the at least one second semiconductor chip and the substrate to each other without using the TSV,
   wherein an area of the at least one second semiconductor chip is smaller than an area of an upper area of the chip stack portion.

2. The semiconductor package of claim 1, wherein the chip stack portion is installed in the substrate to have a flip-chip type.

3. The semiconductor package of claim 1, wherein the signal transmitting medium is disposed on at least one lateral surface of the chip stack portion and extends from an upper surface of the at least one second semiconductor chip so as to connect the at least one second chip and the substrate directly to each other.

4. The semiconductor package of claim 1, wherein an area of the at least one second semiconductor chip is smaller than an area of an upper area of the chip stack portion.

5. The semiconductor package of claim 1, wherein an area of an upper surface of the chip stack portion is determined according to a greater area from among an area of the first chip and an area of the second chip.

6. The semiconductor package of claim 1, wherein the internal sealing member extends along a lateral surface of a smaller chip from among the first chip and the second chip such that the chip stack portion has a rectangular parallelepiped shape.

7. The semiconductor package of claim 1, wherein the first semiconductor chip disposed at the uppermost portion of the chip stack portion is smaller than the at least one second semiconductor chip.

8. The semiconductor package of claim 1, wherein the internal sealing member comprises an underfill portion filling a space between the plurality of first semiconductor chips, and a cover portion disposed outside the underfill portion, and is formed so as not to cover an upper surface of the first semiconductor chip disposed at the uppermost portion of the chip stack portion.

9. The semiconductor package of claim 1, wherein the semiconductor package comprises a plurality of second semiconductor chips, and wherein the second chip disposed at an upper portion is smaller than the second semiconductor chip disposed at a lower portion.

10. The semiconductor package of claim 1, further comprising:
a first sealing member to cover a lower surface and a lateral surfaces of the chip stack portion; and
a second sealing member disposed outside the first sealing member and surrounding the chip stack portion and the at least one second semiconductor chip.

11. The semiconductor package of claim 10, wherein the signal transmitting medium is a conductive connection portion that is connected to the at least one second semiconductor chip on an upper surface of the at least one second semiconductor chip and extends to the substrate along a lateral surface of the at least one second semiconductor chip and an upper surface of the first sealing member.

12. The semiconductor package of claim 1, wherein the signal transmitting medium is a wire.

13. The semiconductor package of claim 1, wherein the first chip comprises a logic semiconductor chip, and
wherein the second chip comprises a memory semiconductor chip.

14. The semiconductor package of claim 1, wherein the at least second chip is disposed between the first chip and the at least one semiconductor chip.

15. A semiconductor package, comprising:
a substrate;
a chip stack portion disposed on the substrate and comprising a semiconductor chip in which a through silicon via (TSV) is formed; and
a second semiconductor chip disposed on the chip stack portion,
wherein the chip stack portion is installed in the substrate to have a flip-chip type, and
wherein the second semiconductor chip is electrically connected to the substrate without passing through the chip stack portion.

16. A semiconductor package, comprising:
a chip-stack portion including a plurality of chips disposed on a substrate such that the chip-stack portion is electrically connected to the substrate by through silicon vias (TSVs);
at least one non-chip-stack portion semiconductor chip disposed above the chip-stack portion and electrically connected to the substrate by a respective signal transmitting medium without using the TSVs; and
an internal sealing member to fill a space between the plurality of chips within the chip-stack portion.

17. The semiconductor package of claim 16, wherein each of the signal transmitting mediums extends from the respective chip to the substrate outside of the internal sealing member.

18. The semiconductor package of claim 16, wherein the chip-stack portion is larger than the at least one non-chip-stack portion semiconductor chip.

19. The semiconductor package of claim 16, further comprising:
a plurality of connection members disposed within the internal sealing member to each correspond to one of the TSVs to electrically interconnect the plurality of chips within the chip-stack portion.

20. The semiconductor package of claim 16, wherein the TSVs are formed integrally within the first semiconductor chip.

* * * * *